United States Patent
Murakami

(10) Patent No.: US 10,928,424 B2
(45) Date of Patent: Feb. 23, 2021

(54) SHUNT RESISTOR

(71) Applicant: SUNCALL CORPORATION, Kyoto (JP)

(72) Inventor: Kenji Murakami, Kyoto (JP)

(73) Assignee: SUNCALL CORPORATION

( * ) Notice: Subject to any disclaimer, the term of this patent is extended or adjusted under 35 U.S.C. 154(b) by 350 days.

(21) Appl. No.: 15/990,064

(22) Filed: May 25, 2018

(65) Prior Publication Data

US 2018/0275171 A1    Sep. 27, 2018

Related U.S. Application Data

(63) Continuation of application No. PCT/JP2017/019011, filed on May 22, 2017.

(30) Foreign Application Priority Data

May 26, 2016    (JP) .............................. JP2016-105077

(51) Int. Cl.
*H01C 1/144* (2006.01)
*H01C 13/00* (2006.01)
(Continued)

(52) U.S. Cl.
CPC ........... *G01R 15/146* (2013.01); *G01R 1/203* (2013.01); *G01R 19/0092* (2013.01); *H01C 1/144* (2013.01); *H01C 13/00* (2013.01); *H01C 13/02* (2013.01); *B60K 6/22* (2013.01); *B60Y 2200/91* (2013.01); *B60Y 2200/92* (2013.01); *Y10S 903/904* (2013.01)

(58) Field of Classification Search
CPC .. G01R 15/146; G01R 1/203; G01R 19/0092; H01C 13/00; H01C 13/02; H01C 1/144; B60K 6/22; B60Y 2200/91; B60Y 2200/92; Y10S 903/904
See application file for complete search history.

(56) References Cited

U.S. PATENT DOCUMENTS

| | | | |
|---|---|---|---|
| 2005/0057865 A1* | 3/2005 | Veloo | G01R 31/364 361/56 |
| 2017/0003322 A1* | 1/2017 | Nakamura | G01R 15/146 |
| 2018/0172735 A1* | 6/2018 | Arai | H01C 1/04 |

FOREIGN PATENT DOCUMENTS

| | | |
|---|---|---|
| JP | 3145791 A | 6/1991 |
| JP | 7320800 A | 12/1995 |

(Continued)

OTHER PUBLICATIONS

Shunt—Nikkohm, 36W Current Shunt Resistors, 2014 (Year: 2014).*

*Primary Examiner* — Daniel R Miller
(74) *Attorney, Agent, or Firm* — St. Onge Steward Johnston & Reens LLC

(57) ABSTRACT

A shunt resistor having sufficient bonding strength includes a resistor, a pair of bases which are integrally formed with the resistor so as to sandwich the resistor, recessed holes which are respectively formed in the bases, and measurement terminals which are inserted into the recessed holes and are affixed to the bases. Each measurement terminal has a shaft part and a flange part that protrudes outwardly in the circumferential direction of the shaft part. Each recessed hole is formed to have a diameter smaller than the diameter of the flange part, and the shaft parts are respectively inserted into the recessed holes.

5 Claims, 3 Drawing Sheets

(51) Int. Cl.
*G01R 1/20* (2006.01)
*G01R 19/00* (2006.01)
*H01C 13/02* (2006.01)
*G01R 15/14* (2006.01)
*B60K 6/22* (2007.10)

(56) References Cited

FOREIGN PATENT DOCUMENTS

| | | | |
|---|---|---|---|
| JP | 2001185639 | A | 7/2001 |
| JP | 200317940 | A | 1/2003 |
| JP | 2009244065 | A | 10/2009 |
| JP | 201711087 | A | 1/2017 |
| WO | 2015156247 | A1 | 10/2015 |

* cited by examiner

SHUNT RESISTOR

FIELD OF THE INVENTION

The present invention relates to shunt resistors and, in particular, to a shunt resistor used to measure the current value on a current path through which a large current flows from a battery for high-voltage applications to a motor circuit that are used in, for example, electric vehicles (EVs), hybrid vehicles (HVs), and plug-in hybrid vehicles (PHVs).

BACKGROUND OF THE INVENTION

Shunt resistors have conventionally been known such as that described in Japanese Published Unexamined Patent Application No. 2009-244065 (Patent Document 1). The shunt resistor includes two plate-shaped bases formed integrally with a resistor therebetween and a measurement terminal portion surface-bonded to each of the bases by ultrasonic welding.

The measurement terminal of such a shunt resistor as described above, however, suffers from a problem of insufficient bonding strength due to reduced welding area.

SUMMARY OF THE INVENTION

The present invention has hence been made in consideration of the above-described problem, and an object thereof is to provide a shunt resistor having a sufficient bonding strength.

The foregoing object of the present invention is achieved by the following means. It is noted that reference signs in the embodiments to be described hereinafter are added in parentheses, but the present invention is not intended to be limited thereto.

The invention of the appended claims is characterized by including:
a resistor (10);
a pair of bases (11) formed integrally with the resistor (10) therebetween;
a recessed hole (11a, first recessed hole 11a1, second recessed hole 11a2) formed in each of the bases (11); and
a measurement terminal (12) inserted into the recessed hole (11a, first recessed hole 11a1, second recessed hole 11a2) to be fixed on each base (11), in which
the measurement terminal (12) includes:
a shaft part (12a); and
a flange part (12b) protruding circumferentially outward from the shaft part (12a).

In accordance with the appended claims, the shunt resistor is then characterized in that
the recessed hole (11a) is formed to have a diameter smaller than that of the flange part (12b), and
the shaft part (12a) is inserted into the recessed hole (11a).

In accordance with the appended claims, the shunt resistor is also characterized in that
the recessed hole is at least formed of a first recessed hole (11a1) having a diameter smaller than that of the flange part (12b) and a second recessed hole (11a2) having a diameter greater than that of the flange part (12b),
the shaft part (12a) is inserted into the first recessed hole (11a1), and
the flange part (12b) is inserted into the second recessed hole (11a2).

On the other hand, in accordance with the appended claims, the shunt resistor is characterized in that for fixation of the measurement terminal (12) on each base (11), the flange part (12b) is welded (12c) on the lateral periphery thereof.

In accordance with the appended claims, the shunt resistor is also characterized in that the measurement terminal (12) is disposed in the vicinity of the resistor (10).

In accordance with the appended claims, the shunt resistor is further characterized in that the diameter of the shaft part (12a) of the measurement terminal (12) is equal to ½ to ⅓ of the thickness of each base (11).

In accordance with the appended claims, the shunt resistor is then characterized in that the measurement terminal (12) is provided with multiple flange parts (12b).

Next will be described advantageous effects of the present invention based on designation by the reference signs in the drawings. It is noted that reference signs in the embodiments to be described hereinafter are added in parentheses, but the present invention is not intended to be limited thereto.

In accordance with the appended claims, since the measurement terminal (12), which includes the shaft part (12a) and the flange part (12b) protruding circumferentially outward from the shaft part (12a), is inserted into the recessed hole (11a, first recessed hole 11a1, second recessed hole 11a2), which is formed in each of the bases (11), to be fixed on each base (11), by providing the flange part (12b), the area for welding can be made wider than conventionally and thereby the load capacity against axial (upward) slipping of the measurement terminal (12) can be increased. Further, since the measurement terminal (12) is inserted into the recessed hole (11a, first recessed hole 11a1, second recessed hole 11a2) to be fixed on each base (11), the load capacity in the thrust direction (horizontal direction) of the measurement terminal (12) can be increased.

The present invention can thus obtain a sufficient bonding strength.

In accordance with the appended claims, since the shunt resistor is also arranged such that the recessed hole (11a) is formed to have a diameter smaller than that of the flange part (12b), and the shaft part (12a) is inserted into the recessed hole (11a), when the shaft part (12a) is inserted into the recessed hole (11a), which is formed in each of the bases (11), the flange part (12b) of the measurement terminal (12) is positioned on the upper surface of the base (11). As a result, the area for welding can be made wider than conventionally and thereby the load capacity against axial (upward) slipping of the measurement terminal (12) can be increased. Further, since the shaft part (12a) of the measurement terminal (12) is inserted into the recessed hole (11a) so that the measurement terminal (12) is fixed on each base (11), the load capacity in the thrust direction (horizontal direction) of the shaft part (12a) of the measurement terminal (12) can also be increased.

The present invention can thus obtain a sufficient bonding strength.

On the other hand, in accordance with the appended claims, since the recessed hole is at least formed of the first recessed hole (11a1) having a diameter smaller than that of the flange part (12b) and the second recessed hole (11a2) having a diameter greater than that of the flange part (12b), the shaft part (12a) is inserted into the first recessed hole (11a1), and the flange part (12b) is inserted into the second recessed hole (11a2), when the shaft part (12a) is inserted into the first recessed hole (11a1) and the flange part (12b) is inserted into the second recessed hole (11a2), which are formed in each of the bases (11), the flange part (12b) of the measurement terminal (12) is positioned on the upper surface of the base (11). As a result, the area for welding can be made wider than conventionally and thereby the load capacity against axial (upward) slipping of the measurement terminal (12) can be increased. Further, since the shaft part (12a) is inserted into the first recessed hole (11a1) and the flange part (12b) is inserted into the second recessed hole (11a2) so that the measurement terminal (12) is fixed on each base (11), the load capacity in the thrust direction (horizontal direction) of the shaft part (12a) and the flange part (12b) of the measurement terminal (12) can be increased.

The present invention can thus obtain a more sufficient bonding strength.

Also, in accordance with the appended claims, for fixation of the measurement terminal (12) on each base (11), the flange part (12b) is welded on the lateral periphery thereof, which therefore has the advantage of easy welding.

Further, in accordance with the appended claims, since the measurement terminal (12) is disposed in the vicinity of the resistor (10), for example, noise during current measurements can be reduced and thereby the accuracy of detection for such current measurements can be increased.

In accordance with the appended claims, since the diameter of the shaft part (12a) of the measurement terminal (12) is then equal to ½ to ⅓ of the thickness of each base (11), the shaft part (12a) can have a small diameter relative to the thickness of the base (11) and thereby the accuracy of detection for current measurements can be prevented from being reduced. It is noted that if the diameter of the shaft part (12a) is smaller than ⅓ of the thickness of each base (11), the shaft part (12a) may undergo reduction in strength and thereby the accuracy of detection for current measurements may be reduced. Also, if the diameter of the shaft part (12a) is greater than ½ of the thickness of each base (11), the accuracy of detection for current measurements may be reduced.

On the other hand, in accordance with the appended claims, since the measurement terminal (12) is provided with multiple flange parts (12b), even if there is a situation that, for example, the welded portion (12c) is broken due to the influence of vibration during vehicle driving or the like on the measurement terminal (12), the welded portions (12c) of the other flange parts (12b) reinforce the broken welded portion (12c), so that the load capacity against axial (upward) slipping of the measurement terminal (12) can be further increased to thereby obtain a more sufficient bonding strength.

BRIEF DESCRIPTION OF THE DRAWINGS

FIGS. 2(a-c) show a process of manufacturing the shunt resistor according to the embodiment, in which

FIGS. 3(a-c) show a process of manufacturing a shunt resistor according to another embodiment, in which

DETAILED DESCRIPTION OF THE INVENTION

An embodiment of a shunt resistor according to the present invention will hereinafter be described specifically with reference to the accompanying drawings. It is noted that in the following description, reference to vertical and horizontal directions will denote the vertical and horizontal directions in a front view of the drawings.

Figure 1A:
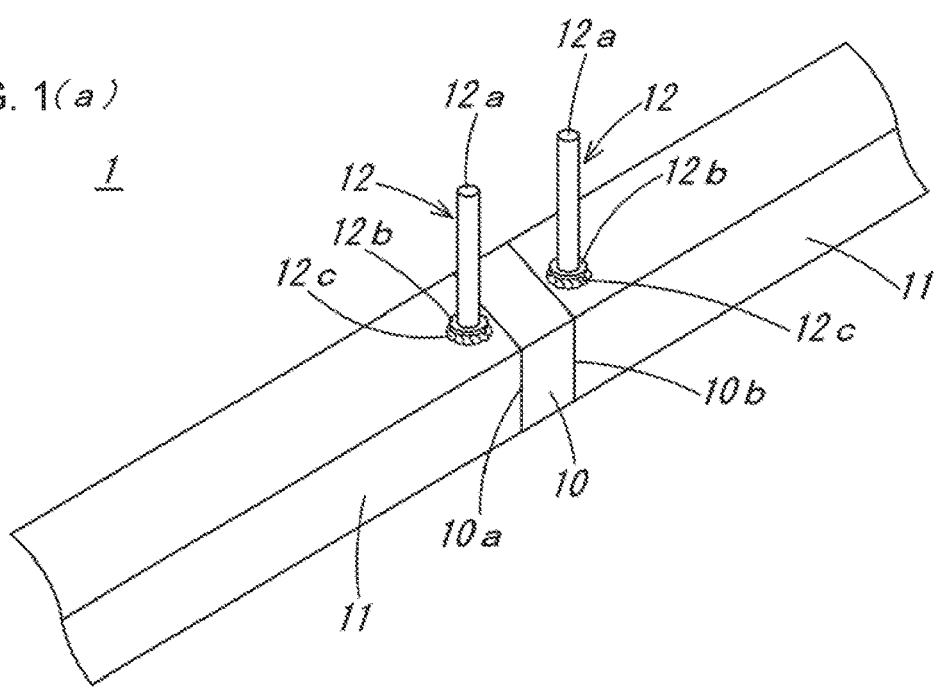
FIG. 1(a) is a perspective view of a shunt resistor according to an embodiment of the present invention.
Figure 1B:
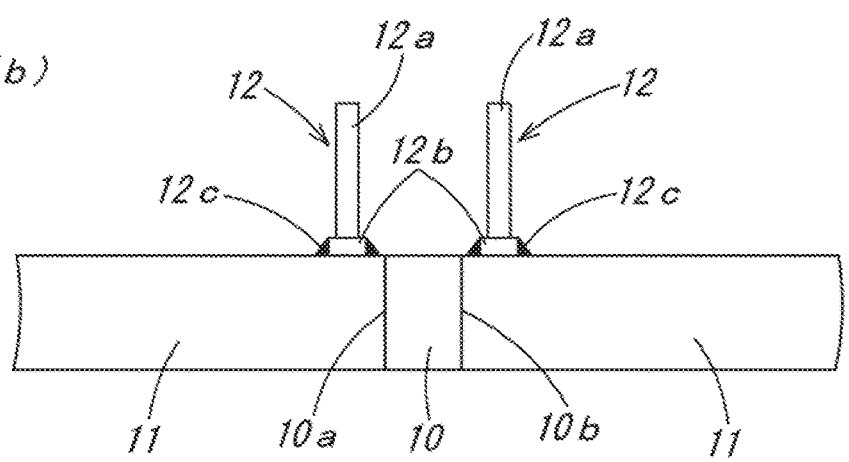
FIG. 1(b) is a front view of the shunt resistor according to the embodiment.

The shunt resistor according to this embodiment is particularly used to measure the current value on a current path through which a large current flows from a battery for high-voltage applications to a motor circuit that are used in, for example, electric vehicles (EVs), hybrid vehicles (HVs), and plug-in hybrid vehicles (PHVs), the shunt resistor 1 including a resistor 10, a pair of bases 11 formed integrally with the resistor 10 therebetween, and a measurement terminal 12 fixed by welding in a standing manner on each of the pair of bases 11, as shown in FIGS. 1(a-c). As shown in FIG. 1(a), the resistor 10 is formed in, for example, a thickened and shortened rectangular shape with a thickness of about 3 mm to 5 mm, preferably formed of, for example, Cu—Mn alloys, Cu—Ni alloys, or Ni—Cr alloys to be a resistor of 50 μΩ to 200 μΩ. As for the side surfaces 10a, 10b of the thus formed resistor 10, the base 11 positioned to the left in the figure is bonded by welding to one side surface 10a of the resistor 10, while the base 11 positioned to the right in the figure is bonded by welding to the other side surface 10b of the resistor 10, as shown in FIGS. 1(a) and 1(b). As a result, this causes the pair of bases 11 to be formed integrally with the resistor 10 therebetween.

Figure 1C:
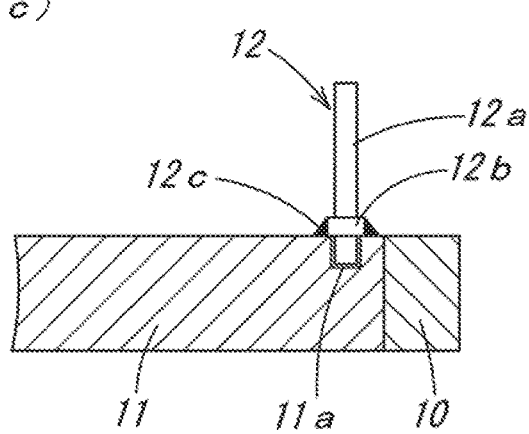
FIG. 1(c) is a partial semi-sectional view of the shunt resistor according to the embodiment.

On the one hand, the bases 11 are so-called bus bars, made of metal such as copper, and formed, for example, in a thickened and lengthened rectangular shape with a thickness of about 3 mm to 5 mm, as shown in FIG. 1(a). A recessed hole 11a with, for example, a diameter of about 1.5 mm to 2 mm and a depth of about 1 mm to 1.5 mm is then formed in the upper surface of each of the bases 11 in the vicinity of each side surface 10a, 10b of the resistor 10, as shown in FIG. 1(c).

On the other hand, the measurement terminal 12, on which a printed circuit board for current detection can be mounted, is formed by, for example, copper or tin plating integrally with a bar-shaped shaft part 12a and a circular flange part 12b positioned on the lower side of the shaft part 12a and provided in a manner protruding therefrom circumferentially outward. The shaft part 12a is a current measurement terminal used to measure the current value, formed to have a diameter of, for example, about 1 mm to 1.5 mm, which is smaller than the diameter of the recessed hole 11a. As a result, as shown in FIG. 1(c), the shaft part 12a can be inserted into the recessed hole 11a.

The diameter of the shaft part 12a is also equal to ½ to ⅓ of the thickness of each base 11. This is for the reason that while each base 11 is required to be thickened particularly so that a large current can flow from a battery for high-voltage applications to a motor circuit that are used in, for example, electric vehicles (EVs), hybrid vehicles (HVs), and plug-in hybrid vehicles (PHVs), increasing accordingly the diameter of the shaft part 12a would cause reduction in the accuracy of detection for current measurements, and it is therefore necessary for the shaft part 12a to have a small diameter so as not to cause reduction in the accuracy of detection for current measurements. Hence, in this embodiment, the shaft part 12a has a diameter equal to ½ to ⅓ of the thickness of each base 11 so as not to cause reduction in the detection accuracy. It is noted that if the diameter of the shaft part 12a is smaller than ⅓ of the thickness of each base 11, the shaft part 12a may undergo reduction in strength and thereby the accuracy of detection for current measurements may be reduced. Also, if the diameter of the shaft part 12a is greater than ½ of the thickness of each base 11, the accuracy of detection for current measurements may be reduced.

On the other hand, the flange part 12b is formed to have a diameter of, for example, about 2.5 mm to 3 mm, which is slightly greater than the diameter of the recessed hole 11a. As a result, as shown in FIG. 1(c), only the shaft part 12a is inserted into the recessed hole 11a, and the flange part 12b is placed on the upper surface of the base 11. In this state, when the flange part 12b is welded 12c by, for example, resistance welding on the lateral periphery thereof, the measurement terminal 12 is fixed in a standing manner on the base 11, as shown in FIGS. 1(a-c) (see particularly FIGS. 1(b) and 1(c)).

Accordingly, by thus providing the measurement terminal 12 with the flange part 12b, the area for welding can be made wider than conventionally and thereby the load capacity against axial (upward) slipping of the measurement terminal 12 is increased. Further, when the shaft part 12a is inserted into the recessed hole 11a so that the measurement terminal 12 is fixed in a standing manner on each base 11, the load capacity in the thrust direction (horizontal direction) of the shaft part 12a is also increased. As a result, sufficient bonding strength can be obtained. It is noted that this embodiment shows an example in which the measurement terminal 12 is provided with only one such flange part 12b, but without limitation thereto, multiple flange parts may be provided, With this arrangement, even if there is a situation that, for example, the welded portion 12c is broken due to the influence of vibration during vehicle driving or the like on the measurement terminal 12, the welded portions 12c of the other flange parts 12b reinforce the broken welded portion 12c, so that the load capacity against axial (upward) slipping of the measurement terminal 12 can be further increased to thereby obtain a more sufficient bonding strength. It is also noted that this embodiment shows an example in which the flange part 12b is welded 12c on the lateral periphery thereof, but without limitation thereto, the entire flange part 12b may be welded. It is however preferred that the flange part 12b is welded 12c on the lateral periphery thereof. This is for the reason that welding on the lateral periphery is advantageously easier than welding entirely.

Incidentally, as shown in FIGS. 1(a-c), the measurement terminal 12 is provided in the vicinity of the resistor 10. This is for the reason that if the measurement terminal 12 is provided in the vicinity of the resistor 10, for example, noise during current measurements can be reduced and thereby the accuracy of detection for such current measurements can be increased. The measurement terminal 12 is therefore provided in the vicinity of the resistor 10. However, in case of contact of a part (e.g. flange part 12b) of the measurement terminal 12 with the resistor 10, the accuracy of detection for current measurements would decrease. It is therefore necessary for the measurement terminal 12 to be provided in the vicinity of the resistor 10 with no contact therebetween.

A process of manufacturing the thus arranged shunt resistor 1 will next be described specifically with reference to FIGS. 2(a-c).

Figure 2A:
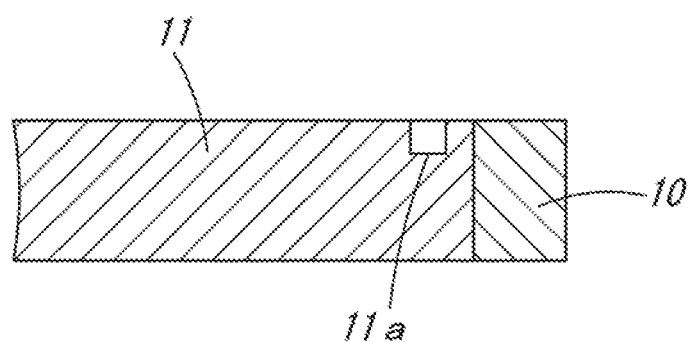
FIG. 2(a) is a partial semi-sectional view showing a state where a recessed hole is formed in a base according to the embodiment.

First, as shown in FIG. 2(a), a recessed hole 11a is formed by punch pressing in the vicinity of a resistor 10 in each of a pair of bases 11 formed integrally with the resistor 10 therebetween. Thus forming the recessed hole 11a by punch pressing allows for increased positioning accuracy and high-speed series production. That is, while each base 11 is required to be thickened particularly so that a large current can flow from a battery for high-voltage applications to a motor circuit that are used in, for example, electric vehicles (EVs), hybrid vehicles (HVs), and plug-in hybrid vehicles (PHVs), it is necessary for the shaft part 12a to have a small diameter so as not to cause reduction in the accuracy of detection for current measurements. Addressing this by opening in each base 11a through hole with a diameter (e.g. about 1.5 mm to 2 mm) equal to or smaller than the thickness (e.g. about 3 mm to 5 mm) of the base 11 (the diameter is equal to about ½ to ⅓ of the thickness of the base 11) creates a potential problem that the drill may be broken during drilling, formation of the through hole, or drawing of the drill out of the through hole after the formation and thereby the through hole may have a burr not to be opened accurately in position. Moreover, opening such a through hole as described above by punch pressing could also create a potential problem of wear of the punch and therefore reduction in workability, which makes it impossible to open the through hole accurately in position and not suited for high-speed series production.

Hence, in this embodiment, not such a through hole but a recessed hole 11a is formed by punch pressing to solve the above-described problems. That is, forming not such a through hole but a recessed hole 11a by punch pressing requires no penetration through the base 11, which can reduce the situation that the punch is worn and therefore reduction in workability. This allows the recessed hole 11a to be opened accurately in position and also allows for high-speed series production. Accordingly, in this embodiment, thus forming the recessed hole 11a by punch pressing allows for increased positioning accuracy and high-speed series production. It is noted that the recessed hole 11a may be formed by drilling. However, this may cause positional deviation in which the recessed hole 11a cannot be formed accurately in position. It is therefore preferred that the recessed hole 11a is formed by punch pressing.

Figure 2B:
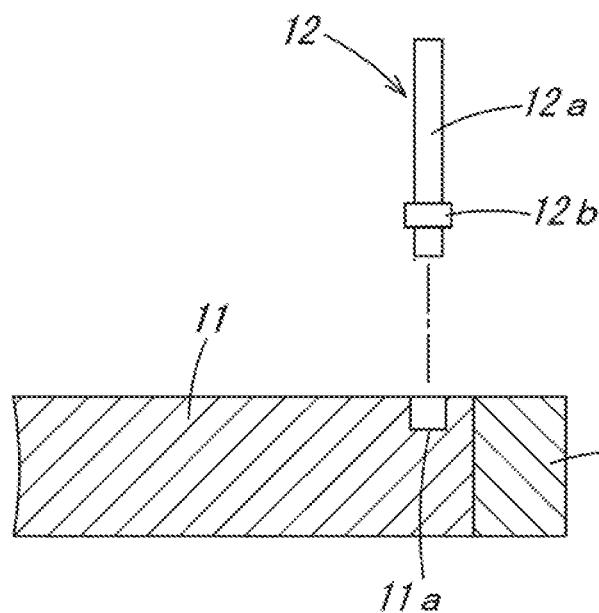
FIG. 2(b) is a partial semi-sectional view showing a state where a shaft part of a measurement terminal is about to be inserted into the recessed hole formed as shown in FIG. 2(a)

After thus forming by punch pressing the recessed hole 11a having high positioning accuracy as described above in the vicinity of the resistor 10 in each of the pair of bases 11, the shaft part 12a is inserted into the recessed hole 11a, as shown in FIG. 2(b). As a result, this allows the measurement terminal 12 to be provided simply and easily in a standing manner on each of the pair of bases 11.

Figure 2C:
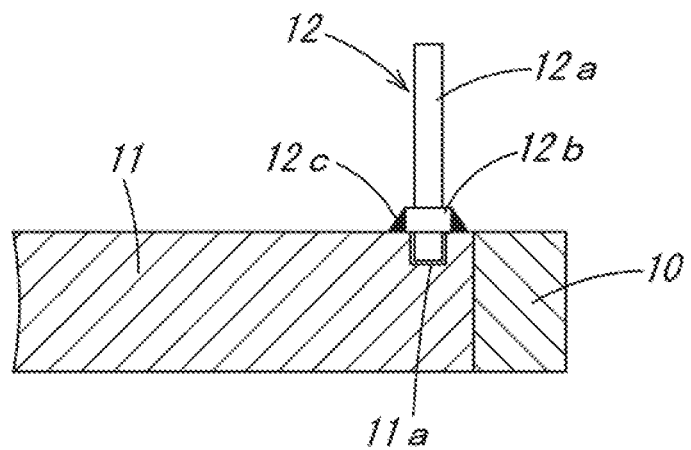
FIG. 2(c) is a partial semi-sectional view showing a state where a flange part is welded on the lateral periphery thereof after the shaft part of the measurement terminal is inserted into the recessed hole.

Next, as shown in FIG. 2(c), when the flange part 12b of the measurement terminal 12 is welded 12c by, for example, resistance welding on the lateral periphery thereof, the measurement terminal 12 can be fixed in a standing manner on each of the pair of bases 11. As a result, the shunt resistor 1 as shown in FIG. 1(a) is manufactured.

As described heretofore, in accordance with the above-described embodiment, since the recessed hole 11a, which has a diameter less than that of the flange part 12b of the measurement terminal 12 but greater than that of the shaft part 12a of the measurement terminal 12, is formed in each base 11, the shaft part 12a of the measurement terminal 12 can be inserted into the recessed hole 11a, while the flange part 12b of the measurement terminal 12 cannot be inserted into the recessed hole 11a. Accordingly, when the shaft part 12a of the measurement terminal 12 is inserted into the recessed hole 11a, the flange part 12b of the measurement terminal 12 is positioned on the upper surface of the base 11. As a result, the area for welding can be made wider than conventionally and thereby the load capacity against axial (upward) slipping of the measurement terminal 12 is increased. Further, since the shaft part 12a of the measurement terminal 12 is inserted into the recessed hole 11a so that the measurement terminal 12 is fixed in a standing manner on each base 11, the load capacity in the thrust direction (horizontal direction) of the shaft part 12a of the measurement terminal 12 can also be increased.

This embodiment can thus obtain a sufficient bonding strength.

Incidentally, this embodiment shows an example in which the recessed hole 11a, in which the shaft part 12a of the measurement terminal 12 can only be inserted, is formed in each base 11, but without limitation thereto, a recessed hole may be provided in which the flange part 12b of the measurement terminal 12 can also be inserted, as shown in FIGS. 3(a-c). This will now be described with reference to FIGS. 3(a-c). It is noted that components identical to those described in FIGS. 1(a-c) and 2(a-c) are designated by the same reference signs to omit the description thereof.

Figure 3A:
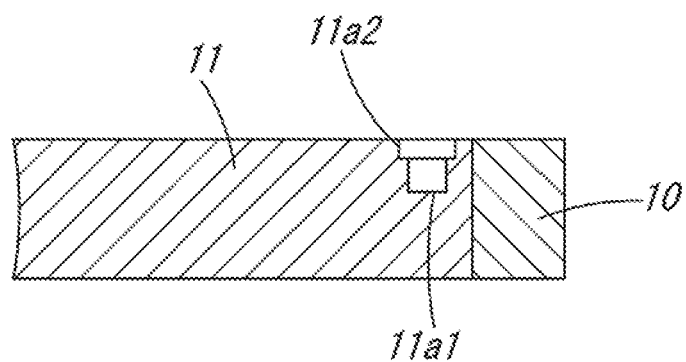
FIG. 3(a) is a partial semi-sectional view showing a state where a first recessed hole and a second recessed hole are formed in a base according to the embodiment.

As shown in FIG. 3(a), a first recessed hole 11a1 and a second recessed hole 11a2 are formed by punch pressing in the vicinity of a resistor 10 in each of a pair of bases 11 formed integrally with the resistor 10 therebetween. For example, the first recessed hole 11a1 is formed to have a diameter of about 1.5 mm to 2 mm and a depth of about 1 mm to 1.5 mm and the second recessed hole 11a2 is formed to have a diameter of about 2.5 mm to 3 mm and a depth of about 0.5 mm to 1.0 mm. That is, the first recessed hole 11a1 is formed to have a diameter greater than that of the shaft part 12a of the measurement terminal 12 but smaller than that of the flange part 12b of the measurement terminal 12, while the second recessed hole 11a2 is formed to have a diameter greater than that of the flange part 12b of the measurement terminal 12.

Figure 3B:
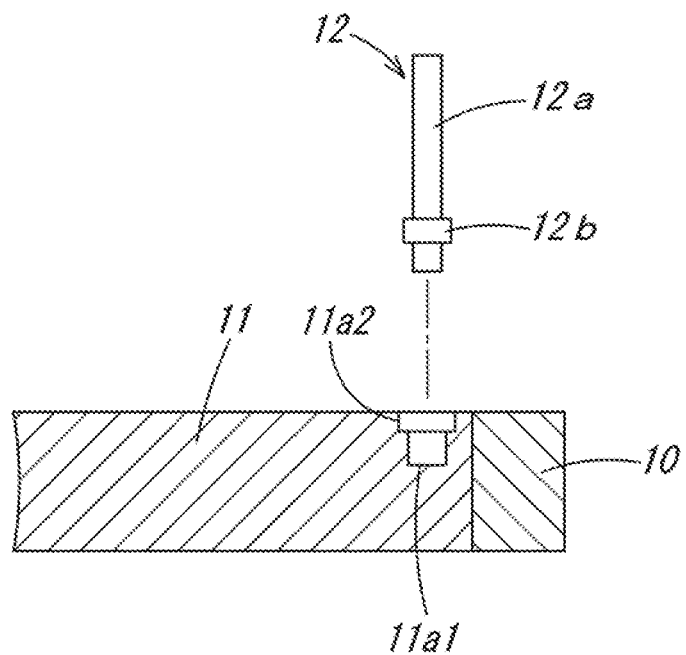
FIG. 3(b) is a partial semi-sectional view showing a state where a shaft part of a measurement terminal is about to be inserted into the first recessed hole and a flange part of the measurement terminal is about to be inserted into the second recessed hole, which are formed as shown in FIG. 3(a)

After thus forming by punch pressing the first recessed hole 11a1 and the second recessed hole 11a2 as described above in the vicinity of the resistor 10 in each of the pair of bases 11, the shaft part 12a is inserted into the first recessed hole 11a1 and the flange part 12b is inserted into the second recessed hole 11a2, as shown in FIG. 3(b). As a result, this allows the measurement terminal 12 to be provided simply and easily in a standing manner on each of the pair of bases 11.

Figure 3C:
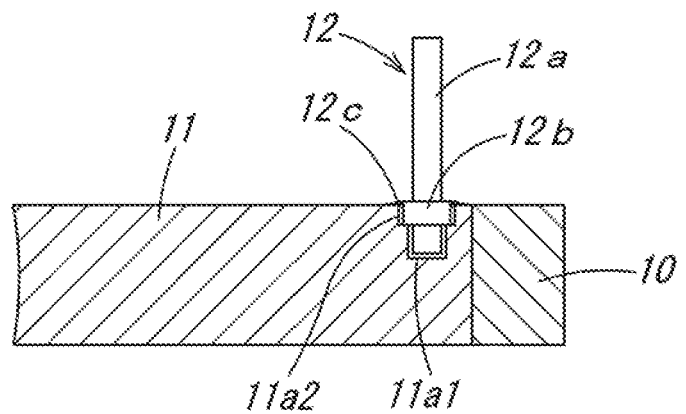
FIG. 3(c) is a partial semi-sectional view showing a state where the flange part is welded on the lateral periphery thereof after the shaft part of the measurement terminal is inserted into the first recessed hole and the flange part of the measurement terminal is inserted into the second recessed hole.

Next, as shown in FIG. 3(c), when the flange part 12b of the measurement terminal 12 is welded 12c by, for example, resistance welding on the lateral periphery thereof, the measurement terminal 12 can be fixed in a standing manner on each of the pair of bases 11. As a result, the shunt resistor 1 as shown in FIG. 1(a) is manufactured.

As described heretofore, also when the shaft part 12a of the measurement terminal 12 is thus inserted into the first recessed hole 11a1 and the flange part 12b of the measurement terminal 12 is thus inserted into the second recessed hole 11a2, the flange part 12b of the measurement terminal 12 is also positioned on the upper surface of the base 11, so that the area for welding can be made wider than conventionally. This in turn allows the load capacity against axial (upward) slipping of the measurement terminal 12 to be increased. Further, since the shaft part 12a is inserted into the first recessed hole 11a1 and the flange part 12b is inserted into the second recessed hole 11a2, the measurement terminal 12 is fixed in a standing manner on the base 11, so that the load capacity in the thrust direction (horizontal direction) of the shaft part 12a and the flange part 12b of the measurement terminal 12 can also be increased.

This embodiment can thus obtain a more sufficient bonding strength.

It is noted that FIGS. 3(a-c) show an example in which only the first recessed hole 11a1 and the second recessed hole 11a2 are provided, but without limitation thereto, if the measurement terminal 12 is provided with multiple flange parts 12b, recessed holes in the number according thereto may be provided, that is, recessed holes other than the first recessed hole 11a1 and the second recessed hole 11a2 may be provided.

(Incidentally, the embodiments described with reference to FIGS. 1(a-c) to 3(a-c) show an example in which welding is performed for fixation of the measurement terminal 12 in a standing manner on each base 11, but without limitation thereto, the measurement terminal 12 may be fixed by press fitting in a standing manner on each base 11.

In addition, the shape of the shunt resistor 1, the resistor 10, the bases 11 and the measurement terminal 12 is merely an example, and various modifications and changes are possible without departing from the spirit and scope of the present invention as defined in the appended claims.

INDUSTRIAL APPLICABILITY

The shunt resistor 1 exemplified in the above-described embodiments is particularly useful to measure the current value on a current path through which a large current flows from a battery for high-voltage applications to a motor circuit that are used in, for example, electric vehicles (EVs), hybrid vehicles (HVs), and plug-in hybrid vehicles (PHVs).

What is claimed is:
1. A shunt resistor comprising:
   a resistor;
   a pair of bases formed integrally with the resistor therebetween;
   a recessed hole formed in at least one base;
   a measurement terminal inserted into the recessed hole on the base;
   the measurement terminal comprises a shaft part and a flange part protruding circumferentially outward from the shaft part;
   the recessed hole having a depth less than a thickness of the base such that the recessed hole has a bottom surface and does not penetrate through the base;
   a bottom surface of the measurement terminal being opposed to the bottom surface of the recessed hole;
   the recessed hole is at least formed of a first recessed hole having a diameter greater than that of the flange part;
   the shaft part is inserted into the first recessed hole; and
   the flange part is inserted into the second recessed hole.
2. The shunt resistor according to claim 1, wherein for fixation of the measurement terminal on each base, the flange part is welded on the lateral periphery thereof.
3. The shunt resistor according to claim 1, wherein the measurement terminal is disposed adjacent to the resistor.

4. The shunt resistor according to claim 1, wherein a diameter of the shaft part of the measurement terminal is equal to ½ to ⅓ of a thickness of each base.

5. The shunt resistor according to claim 1, wherein the measurement terminal is provided with a plurality of flange parts.

* * * * *